US010082539B2

(12) United States Patent
Jasionowski

(10) Patent No.: US 10,082,539 B2
(45) Date of Patent: Sep. 25, 2018

(54) USING DIRECT SUMS AND INVARIANCE GROUPS TO TEST PARTIALLY SYMMETRIC QUANTUM-LOGIC CIRCUITS

(71) Applicant: International Business Machines Corporation, Armonk, NY (US)

(72) Inventor: Pawel Jasionowski, Wroclaw (PL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/194,645

(22) Filed: Jun. 28, 2016

(65) Prior Publication Data

US 2017/0370989 A1  Dec. 28, 2017

(51) Int. Cl.
*G01R 31/00* (2006.01)
*G01R 31/3177* (2006.01)
(Continued)

(52) U.S. Cl.
CPC .......... *G01R 31/3177* (2013.01); *G06F 17/11* (2013.01); *G06F 17/16* (2013.01);
(Continued)

(58) Field of Classification Search
CPC ..... G01R 31/3177; G06F 17/11; G06F 17/16; G06N 99/002; H03K 19/0022; H03K 9/017509
See application file for complete search history.

(56) References Cited

U.S. PATENT DOCUMENTS 7,019,875 B2 *  3/2006  Pittman .................. B82Y 10/00
                                                      359/107
7,046,366 B2 *  5/2006  Ozeki .................. G01M 11/338
                                                      356/477
(Continued)

FOREIGN PATENT DOCUMENTS

JP          5700827         2/2015

OTHER PUBLICATIONS

University of Michigan, AFRL-IF-RS-TR-2006-216, Final Technical Report, Jun. 2006, Quantum Approaches to Logic Circuit Synthesis and Testing, 54 pages.

(Continued)

*Primary Examiner* — Esaw T Abraham
(74) *Attorney, Agent, or Firm* — Schmeiser, Olsen & Watts, LLP; John Pivnichny

(57) ABSTRACT

A method and associated systems for using direct sums and invariance groups to optimize the testing of partially symmetric quantum-logic circuits is disclosed. A test system receives information that describes the architecture of a quantum-logic circuit to be tested. The system uses this information to organize the circuit's inputs into two or more mutually exclusive subsets of inputs. The system computes a direct sum of a set of groups associated with the subsets in order to generate an invariance group that contains one or more invariant permutations of the circuit's inputs. These invariant permutations can be used to reduce the number of tests required to fully verify the circuit for all possible input (Continued)

vectors. Once one specific input vector has been verified, there is no need to test other vectors that can be generated by performing any one of the invariant permutations upon the previously verified vector.

17 Claims, 2 Drawing Sheets

(51) Int. Cl.
  *G06N 99/00*    (2010.01)
  *G06F 17/16*    (2006.01)
  *G06F 17/11*    (2006.01)
  *H03K 19/00*    (2006.01)
  *H03K 19/0175*  (2006.01)

(52) U.S. Cl.
  CPC ....... *G06N 99/002* (2013.01); *H03K 19/0002* (2013.01); *H03K 19/017509* (2013.01)

(56) References Cited

U.S. PATENT DOCUMENTS

| | | | | |
|---|---|---|---|---|
| 7,246,240 B2* | 7/2007 | Chuang | ................. | H04L 9/3247 380/256 |
| 7,355,769 B2* | 4/2008 | Pittman | ................. | B82Y 10/00 359/107 |
| 7,359,101 B2* | 4/2008 | Beausoleil | ............ | B82Y 10/00 359/107 |
| 7,398,507 B2 | 7/2008 | Chang et al. | | |
| 7,498,832 B2* | 3/2009 | Baumgardner | ........ | B82Y 10/00 326/3 |
| 7,570,767 B2* | 8/2009 | Lo | ........................ | H04L 1/0041 380/256 |
| 7,714,605 B2* | 5/2010 | Baumgardner | ........ | B82Y 10/00 326/3 |
| 8,612,499 B1* | 12/2013 | Tucci | ..................... | G06F 7/544 708/200 |
| 9,494,561 B1* | 11/2016 | Safai | | |
| 9,577,764 B2* | 2/2017 | Zhao | | |
| 2006/0123363 A1* | 6/2006 | Williams | ............... | B82Y 10/00 716/101 |
| 2015/0339417 A1 | 11/2015 | Garcia-Ramirez et al. | | |

OTHER PUBLICATIONS

Bullock et al., An Arbitrary Two-qubit Computation in 23 Elementary Gates, arXiv:quant-ph/0211002v3, Mar. 3, 2003,19 pages.
Viamontes et al., Gate-Level Simulation of Quantum Circuits, 0-7803-7659-5/03, copyright 2003 IEEE, pp. 295-301.
Shende et al., Recognizing Small-Circuit Structure in Two-Qubit Operators and Timing Hamiltonians to Compute Controlled-Not Gates, arXiv:quant-ph/0308045v3. Dec. 31, 2003, 4 pages.

* cited by examiner

USING DIRECT SUMS AND INVARIANCE GROUPS TO TEST PARTIALLY SYMMETRIC QUANTUM-LOGIC CIRCUITS

TECHNICAL FIELD

The present invention relates to testing quantum-logic circuits and in particular to using direct-sum computations to test partially symmetric quantum-logic circuits.

BACKGROUND

Unlike conventional binary logic, quantum logic is not limited to binary states of 0 and 1. Inputs and outputs of quantum-logic circuits may thus assume far more states than analogous binary-logic circuits, greatly increasing the number of tests that may be performed upon a quantum-logic circuit (or "q-module") to verify correct operation. Testing a q-module comprising larger numbers of inputs and states can therefore be prohibitively expensive or resource-intensive.

BRIEF SUMMARY

A first embodiment of the present invention provides a quantum-logic test-development system comprising a processor, a memory coupled to the processor, and a computer-readable hardware storage device coupled to the processor, the storage device containing program code configured to be run by the processor via the memory to implement a method for using direct sums and invariance groups to test partially symmetric quantum-logic circuits, the method comprising:

the system receiving architectural information about a quantum-logic circuit that has at least four inputs and at least one output;

the system, as a function of the architectural information, dividing the at least four inputs into two or more non-intersecting subsets;

the system creating a set of groups that each comprise a subset, selected from the set of two or more non-intersecting subsets, and one or more permutation operations capable of being performed upon inputs comprised by the selected subset;

the system generating a direct sum of the set of groups, where the direct sum identifies an invariance group of a function that represents functionality of the quantum-logic circuit, where the invariance group comprises a set of invariant permutations, where each permutation of the set of invariant permutations identifies a permutation of two or more inputs comprised by one and only one subset of the two or more non-intersecting subsets, and where no output of the quantum-logic circuit changes state when any permutation of the set of invariant permutations is performed upon the at least four inputs of the quantum-logic circuit.

A second embodiment of the present invention provides method for using direct sums and invariance groups to test partially symmetric quantum-logic circuits, the method comprising:

receiving architectural information about a quantum-logic circuit that has at least four inputs and at least one output;

dividing the at least four inputs, as a function of the architectural information, into two or more non-intersecting subsets;

creating a set of groups that each comprise a subset, selected from the set of two or more non-intersecting subsets, and one or more permutation operations capable of being performed upon inputs comprised by the selected subset;

generating a direct sum of the set of groups, where the direct sum identifies an invariance group of a function that represents functionality of the quantum-logic circuit, where the invariance group comprises a set of invariant permutations, where each permutation of the set of invariant permutations identifies a permutation of two or more inputs comprised by one and only one subset of the two or more non-intersecting subsets, and where no output of the quantum-logic circuit changes state when any permutation of the set of invariant permutations is performed upon the at least four inputs of the quantum-logic circuit.

A third embodiment of the present invention provides a computer program product, comprising a computer-readable hardware storage device having a computer-readable program code stored therein, the program code configured to be executed by a quantum-logic test-development system comprising a processor, a memory coupled to the processor, and a computer-readable hardware storage device coupled to the processor, the storage device containing program code configured to be run by the processor via the memory to implement a method for using direct sums and invariance groups to test partially symmetric quantum-logic circuits, the method comprising:

receiving architectural information about a quantum-logic circuit that has at least four inputs and at least one output;

dividing the at least four inputs, as a function of the architectural information, into two or more non-intersecting subsets;

creating a set of groups that each comprise a subset, selected from the set of two or more non-intersecting subsets, and one or more permutation operations capable of being performed upon inputs comprised by the selected subset;

generating a direct sum of the set of groups, where the direct sum identifies an invariance group of a function that represents functionality of the quantum-logic circuit, where the invariance group comprises a set of invariant permutations, where each permutation of the set of invariant permutations identifies a permutation of two or more inputs comprised by one and only one subset of the two or more non-intersecting subsets, and where no output of the quantum-logic circuit changes state when any permutation of the set of invariant permutations is performed upon the at least four inputs of the quantum-logic circuit.

DETAILED DESCRIPTION

Figure 1:
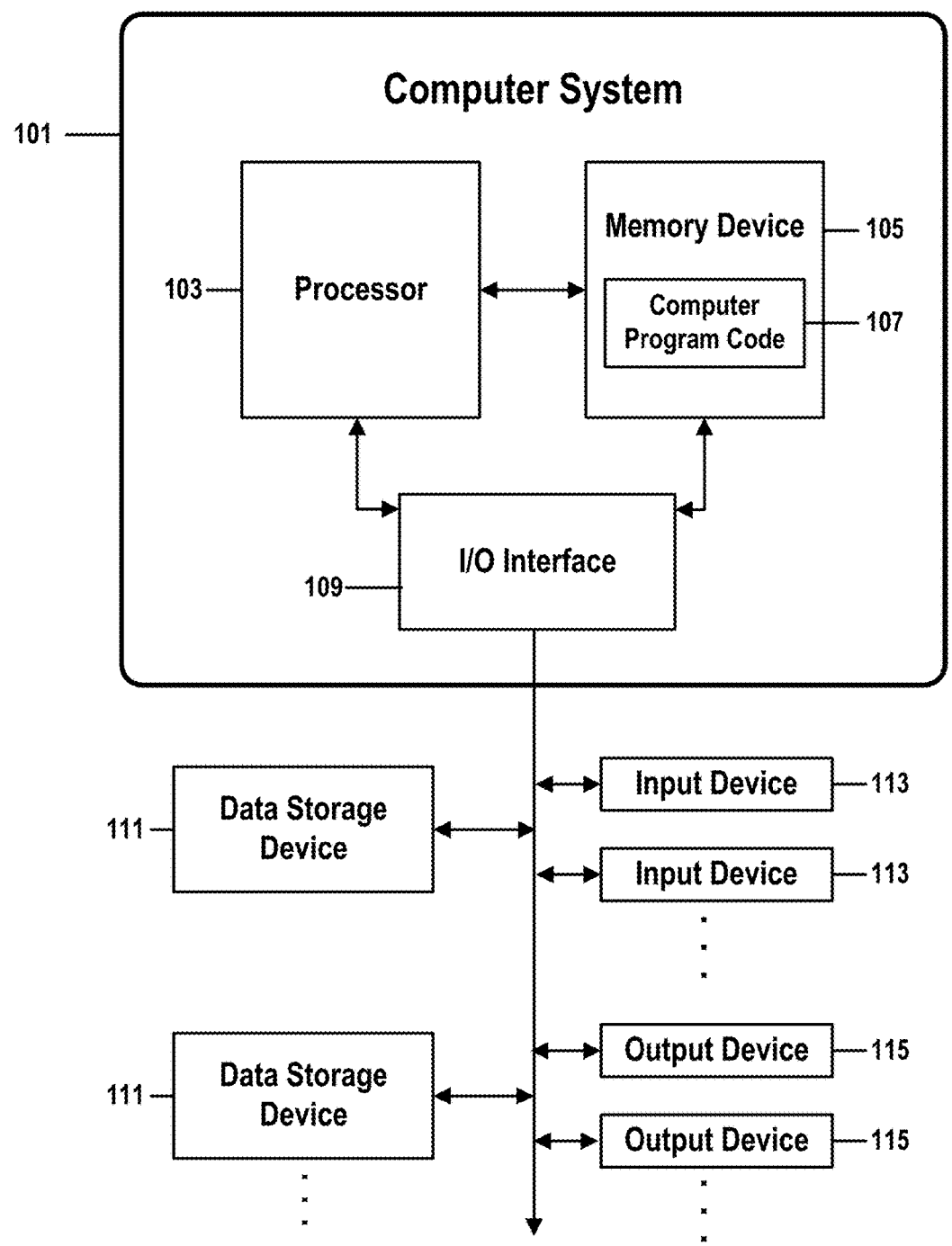
FIG. 1 shows the structure of a computer system and computer program code that may be used to implement a method for using direct sums and invariance groups to test partially symmetric quantum-logic circuits in accordance with embodiments of the present invention.

Embodiments of the present invention streamline the testing process for a class of quantum-logic circuits known as "partially symmetric" circuits.

Testing a quantum-logic circuit (or "q-module") can be far more time-consuming and resource-intensive than testing conventional binary logic circuits because quantum logic is not limited to two states. Where verifying operation of a two-input binary AND circuit would require four tests, corresponding to four possible binary inputs {00, 01, 10, and 11}, a two-input q-module that supports four states A, B, C, and D), would require 16 tests to test 16 possible input states {AA, AB, AC, AD, BA, BB, BC, BD, CA, CB, CC, CD, DA, DB, DC, and DD}. Embodiments of the present invention solve this technical problem by enhancing the operation of a circuit-testing software application or a hardware circuit-testing device.

The number of necessary tests needed to verify a q-module increases as a geometric function of the circuit's number of states or number of inputs. In general, a circuit with n inputs and t states (t>1) would require $t^n$ tests in order to verify each possible set of input values. An n-input binary-logic circuit that supports only values of 0 and 1 would thus require only $2^n$ tests.

In general, permuting any of a q-module's inputs causes its output to change. Consider, for example, a 3-input, 1-output q-module with inputs $\{x_1, x_2, x_3\}$, each of which can be in any of four states $\{A, B, C, D\}$. The module's single output can be in any of three states $\{E, F, G\}$. The three inputs may be reordered into six possible permutations: $(x_1, x_2, x_3)$, $(x_1, x_3, x_2)$, $(x_2, x_1, x_3)$ $(x_2, x_3, x_1)$, $(x_3, x_1, x_2)$, and $(x_3, x_2, x_1)$. If inputs $(x_1, x_2, x_3)$ are initially in states (A, B, C), permuting the order of two of those inputs to $(x_1, x_3, x_2)$ would reorder the input states to (A, C, B). This permutation will in general cause the q-module's output to change.

A characteristic of some q-modules, however, is that certain permutations of the module's inputs never produce a change to the module's output state, regardless of the states of each input prior to permutation. If this is true of all possible permutations of all inputs, the circuit is said to be symmetrical. If it is true of only a proper subsets of all possible permutations of inputs, the circuit is said to be partially symmetrical. Note that nearly all q-modules are symmetric with respect to an identity permutation (id), which may consist of a permutation of 0 inputs. The identity permutation may be mentioned in examples and embodiments described in this document, but it should be considered a trivial case within the context of the present invention.

In the running example, the previously described 3-input, 1-output, 4-state quantum circuit may produce output E in response to receiving any input through inputs $(x_1, x_2, x_3)$. After permuting the $x_2$ and $x_3$ inputs to reorder the q-module's inputs to $(x_1, x_3, x_2)$, the circuit may still produce the same output E. Then, a permutation (2,3) (which swaps the second and third inputs $x_2$ and $x_3$) is said to be an element of a "Boolean function invariance group" or of a "symmetry group" of a function f( ) represented by the q-module, and the q-module itself is said to be "symmetric" under permutation (2,3). In this document, we will refer to function f( ) as $f_k(\underline{x})$, where $\underline{x}$ is an n-tuple vector representation $(x_1, \ldots, x_n)$ of the q-module's n inputs.

One property of an invariance group is that the permutations contained by the group are invariant regardless of the initial states of the permuted inputs. In the above example, the one-permutation invariance group {(2,3)} specifies that permuting the q-module's second and third inputs never changes the module's output. So, for example, if the states of the inputs change from (ABA) to (AAB), from (CCB) to (CBC), or from (CBA) to (CAB), the output of the q-module does not change.

Embodiments of the present invention employ this concept of invariance groups to greatly reduce the number of input vectors $\underline{x}$ that must be tested in order fully verify a q-module. Because applying an invariant permutation to a q-module's input vector $\underline{x}$ is known to leave the q-module's output unchanged, once that initial vector $\underline{x}$ has been tested, any other vector that may be generated by applying the invariant permutation to $\underline{x}$ is automatically deemed to have been verified. When an invariance group of a partially symmetric q-module comprises a significant number of permutations, embodiments of the present invention may dramatically reduce the number of tests required to fully verify the circuit.

FIG. 1 shows a structure of a computer system and computer program code that may be used to implement a method for using direct sums and invariance groups to test partially symmetric quantum-logic circuits in accordance with embodiments of the present invention. FIG. 1 refers to objects 101-115.

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module," or "system."

The present invention may be a system a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed upon the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In FIG. 1, computer system 101 comprises a processor 103 coupled through one or more I/O Interfaces 109 to one or more hardware data storage devices 111 and one or more I/O devices 113 and 115.

Hardware data storage devices 111 may include, but are not limited to, magnetic tape drives, fixed or removable hard disks, optical discs, storage-equipped mobile devices, and solid-state random-access or read-only storage devices. I/O devices may comprise, but are not limited to: input devices 113, such as keyboards, scanners, handheld telecommunications devices, touch-sensitive displays, tablets, biometric readers, joysticks, trackballs, or computer mice; and output devices 115, which may comprise, but are not limited to printers, plotters, tablets, mobile telephones, displays, or sound-producing devices. Data storage devices 111, input devices 113, and output devices 115 may be located either locally or at remote sites from which they are connected to I/O Interface 109 through a network interface.

Processor 103 may also be connected to one or more memory devices 105, which may include, but are not limited to, Dynamic RAM (DRAM), Static RAM (SRAM), Programmable Read-Only Memory (PROM), Field-Programmable Gate Arrays (FPGA), Secure Digital memory cards, SIM cards, or other types of memory devices.

At least one memory device 105 contains stored computer program code 107, which is a computer program that comprises computer-executable instructions. The stored computer program code includes a program that implements a method for using direct sums and invariance groups to test partially symmetric quantum-logic circuits in accordance with embodiments of the present invention, and may implement other embodiments described in this specification, including the methods illustrated in FIGS. 1-2. The data storage devices 111 may store the computer program code 107. Computer program code 107 stored in the storage devices 111 is configured to be executed by processor 103 via the memory devices 105. Processor 103 executes the stored computer program code 107.

In some embodiments, rather than being stored and accessed from a hard drive, optical disc or other writeable, rewriteable, or removable hardware data-storage device 111, stored computer program code 107 may be stored on a static, nonremovable, read-only storage medium such as a Read-Only Memory (ROM) device 105, or may be accessed by processor 103 directly from such a static, nonremovable, read-only medium 105. Similarly, in some embodiments, stored computer program code 107 may be stored as computer-readable firmware 105, or may be accessed by processor 103 directly from such firmware 105, rather than from a more dynamic or removable hardware data-storage device 111, such as a hard drive or optical disc.

Thus the present invention discloses a process for supporting computer infrastructure, integrating, hosting, maintaining, and deploying computer-readable code into the computer system 101, wherein the code in combination with the computer system 101 is capable of performing a method for using direct sums and invariance groups to test partially symmetric quantum-logic circuits.

Any of the components of the present invention could be created, integrated, hosted, maintained, deployed, managed, serviced, supported, etc. by a service provider who offers to facilitate a method for using direct sums and invariance groups to test partially symmetric quantum-logic circuits. Thus the present invention discloses a process for deploying or integrating computing infrastructure, comprising integrating computer-readable code into the computer system 101, wherein the code in combination with the computer system 101 is capable of performing a method for using direct sums and invariance groups to test partially symmetric quantum-logic circuits.

One or more data storage units 111 (or one or more additional memory devices not shown in FIG. 1) may be used as a computer-readable hardware storage device having a computer-readable program embodied therein and/or having other data stored therein, wherein the computer-readable program comprises stored computer program code 107. Generally, a computer program product (or, alternatively, an article of manufacture) of computer system 101 may comprise the computer-readable hardware storage device.

While it is understood that program code 107 for a method for using direct sums and invariance groups to test partially symmetric quantum-logic circuits may be deployed by manually loading the program code 107 directly into client, server, and proxy computers (not shown) by loading the program code 107 into a computer-readable storage medium (e.g., computer data storage device 111), program code 107 may also be automatically or semi-automatically deployed into computer system 101 by sending program code 107 to a central server (e.g., computer system 101) or to a group of central servers. Program code 107 may then be downloaded into client computers (not shown) that will execute program code 107.

Alternatively, program code 107 may be sent directly to the client computer via e-mail. Program code 107 may then either be detached to a directory on the client computer or loaded into a directory on the client computer by an e-mail option that selects a program that detaches program code 107 into the directory.

Another alternative is to send program code 107 directly to a directory on the client computer hard drive. If proxy servers are configured, the process selects the proxy server code, determines on which computers to place the proxy servers' code, transmits the proxy server code, and then installs the proxy server code on the proxy computer. Program code 107 is then transmitted to the proxy server and stored on the proxy server.

In one embodiment, program code 107 for a method for using direct sums and invariance groups to test partially symmetric quantum-logic circuits is integrated into a client, server and network environment by providing for program code 107 to coexist with software applications (not shown), operating systems (not shown) and network operating systems software (not shown) and then installing program code 107 on the clients and servers in the environment where program code 107 will function.

The first step of the aforementioned integration of code included in program code 107 is to identify any software on the clients and servers, including the network operating system (not shown), where program code 107 will be deployed that are required by program code 107 or that work in conjunction with program code 107. This identified software includes the network operating system, where the network operating system comprises software that enhances a basic operating system by adding networking features. Next, the software applications and version numbers are identified and compared to a list of software applications and correct version numbers that have been tested to work with program code 107. A software application that is missing or that does not match a correct version number is upgraded to the correct version.

A program instruction that passes parameters from program code 107 to a software application is checked to ensure that the instruction's parameter list matches a parameter list required by the program code 107. Conversely, a parameter passed by the software application to program code 107 is checked to ensure that the parameter matches a parameter required by program code 107. The client and server operating systems, including the network operating systems, are identified and compared to a list of operating systems, version numbers, and network software programs that have been tested to work with program code 107. An operating system, version number, or network software program that does not match an entry of the list of tested operating systems and version numbers is upgraded to the listed level on the client computers and upgraded to the listed level on the server computers.

After ensuring that the software, where program code 107 is to be deployed, is at a correct version level that has been tested to work with program code 107, the integration is completed by installing program code 107 on the clients and servers.

Embodiments of the present invention may be implemented as a method performed by a processor of a computer system, as a computer program product, as a computer system, or as a processor-performed process or service for supporting computer infrastructure.

Figure 2:
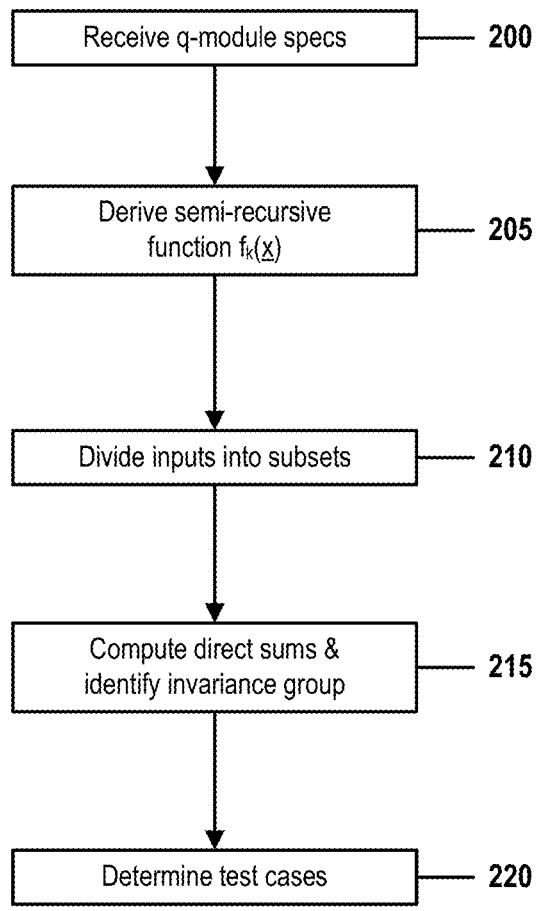
FIG. 2 is a flow chart that illustrates steps of a method for using direct sums and invariance groups to test partially symmetric quantum-logic circuits in accordance with embodiments of the present invention.

FIG. 2 is a flow chart that illustrates steps of a method for using direct sums and invariance groups to test partially symmetric quantum-logic circuits in accordance with embodiments of the present invention. FIG. 2 shows elements identified by reference numbers 200-220.

In step 200, a processor of a quantum-logic test-development system receives a description of a quantum-logic circuit, or "q-module" with n inputs $\{x_1 \ldots x_n\}$, each of which may assume any of t states, and one output that can assume any of s states. The operation performed by this q-module can be expressed as a function $f_K(\underline{x})$ that maps each n-element input vector $\underline{x}=\{x_1, \ldots, x_n\}$ onto one of the s output states.

In one example, a two-input, one-output quantum circuit device has two inputs $\{x_1, x_2\}$ that may each assume any of three states $\{0, 1, 2\}$. The circuit's output $f(\underline{x})$ may assume any of four states $\{0, 1, 2, 3\}$. In this example, n=2, t=4, and the set of all possible input vectors is $\{(00), (01), (02), (10), (11), (12), (20), (21), (22)\}$.

In another example, inputs $\{x1, x2, x3\}$ of a 3-input, 1-output-state q-module with output that can assume any of s distinct states. The state of the three inputs are represented by an input vector x=(x1, x2, x3) and the values (or states) assumed by each input comprised by this vector may be subject to permutations that include (id), (12), (13), (23), (123), or (312). As described above, the inputs of the q-module may be reordered by permutations into any of six possible distinct orders: (x1, x2, x3), (x1, x3, x2), (x2, x1, x3), (x2, x3, x1), (x3, x1, x2), and (x3, x2, x1).

If the operation of the q-module can be represented by a function f(x) that maps each possible input vector x onto a corresponding value of s, one possible invariance group might contain a set of permutations $\{(1,2),(2,3)\}$, which correspond to input permutations (x2, x1, x3) and (x1, x3, x2). Because these permutations are invariant, swapping either the first two inputs $\{x1, x2\}$ or the last two inputs $\{x2, x3\}$ will not change the output of the q-module. For example, an input (010) would produce the same output as would inputs (100) (permutation (x1, x2)) and (001) (permutation (x2, x3)).

Because f(x1, x2, x3)=f(x2, x3)=f(x1, x3, x2) in this example, it is possible to simultaneously test three input vectors by testing only one of them.

In step 205, the system identifies a function $f(\underline{x})$ that represents the functionality performed by the q-module upon an n-tuple input vector $\underline{x}$ that represents an ordered set of n inputs of the q-module. The domain of function f consists of all inputs $\underline{x}=\{x1, x2, \ldots, xn\}$ of the q-module, and the value of any f(x1, x2, ..., xn) is defined as an output state of q-module for input vector x=(x1, x2, ..., xn).

Expressed more formally, the operation generated by a quantum module M can be represented by function $f: \{0, 1, \ldots, t-1\}^n \to \{0, 1, \ldots, s-1\}$, and the value of $f(x_1, x_2, \ldots, x_n)$ is the output produced by M in response to receiving input vector $\underline{x}=(x_1, x_2, \ldots, x_n)$. The set S(f) of all possible permutations of M's inputs that do not change the output of M is called an invariance group, or a symmetry group, of $f(\underline{x})$.

This may be stated as:

f: $\{0, 1, \ldots, t-1\}^n \to \{0, 1, \ldots, s-1\}$, where t>1, s>1.

σ is a permutation comprised by symmetric group $S_n$, where $S_n$ contains permutations of indexes of input vector $\underline{x}=(x_1, x_2, \ldots, x_n)$.

The action of permutation σ on $f(x_1, x_2, \ldots, x_n)$ may be expressed as:

$f^\sigma(x_1, x_2, \ldots, x_n) = f(x_{\sigma(1)}, x_{\sigma(2)}, \ldots, x_{\sigma(n)})$. That is, applying function $f^\sigma$ to an input vector $\underline{x}$ is equivalent to applying function $f(\underline{x})$ to an input vector $\underline{x}^\sigma = \{x_{\sigma(1)}, x_{\sigma(2)}, \ldots, x_{\sigma(n)}\}$, where $\underline{x}^\sigma$=a permuted set of inputs created by applying permutation σ to $\underline{x}$.

S(f)=$\{\sigma \in Sn: f=f^\sigma\}$. That is, S(f) is the set of all permutations σ that, when performed upon an input vector $\underline{x}$, do not change the output value of f( ).

The set of permutations S(f) is thus the invariance group, or symmetry group of f( ).

In step 210, the system divides the q-module's n inputs $\{x_1 \ldots x_n\}$ into k subsets by any means known in the art. This division may be performed as a function of the architecture of the q-module and, in many cases, a person skilled in the art may identify logical split points that divide the inputs by referring to product documentation published by the manufacturer of the q-module.

The examples described here refer to this set of k subsets as $\{A_i\}$, i=1, 2, ... k. The total number of inputs in an $i^{th}$ subset is represented as $|A_i|=n_i$, where $(n_1+n_2+ \ldots n_k)=n$ (the total number of inputs). In other words, every input of the q-module is contained in one and only one of k mutually exclusive, or disjoint, subsets $A_i$.

Subsequent steps of FIG. 2 will consider only permutations that preserve the division of inputs into subsets $\{A_i\}$. That is, each permutation will permute only inputs that are in the same subset. None will permute inputs from more than one subset.

In step 215, the system identifies an invariance group of function f( ) as a direct sum of a set of groups that each comprise one of the subsets identified in step 210. Here, each group can be expressed as (G,X), where X is a subset of inputs and G is a set of permutations that may be performed upon the inputs comprised by X. If, for example, three subsets $A_1$, $A_2$, and $A_3$, were identified in step 210, the system here creates three sets of permutation operations $G_1$, $G_2$, and $G_3$, each of which comprises a set of permutations that may be performed upon inputs comprised by one of the three subsets. The system then generates three groups ($G_1$, $A_1$), ($G_2$,$A_2$), and ($G_3$,$A_3$), where each $\{Gi\}$ is a set of permutations of inputs of a corresponding subset Ai. The system generates the invariance group as the direct sum:

$$(G_1, A_1) \oplus (G_2, A_2) \oplus (G_3, A_3).$$

As used here, the direct sum operator $\oplus$ generates an output group as a function of two or more input groups. Consider, for example, a case in which the system in step 210 divided a q-module's n inputs into two subgroups $A_1$ and $A_2$, where $A_1$ contains n1 inputs, $A_2$ contains n2 inputs, and n1+n2=n.

This may be expressed by the statements:

$$A_1 = \{x_1 \ldots x_{n1}\},$$

$$A_2 = \{x_{n1+1} \ldots x_n\},$$

$$|A_1|=n1, \text{ and}$$

$$|A_2|=n2.$$

If G represents all possible permutations of subset $A_1$'s inputs $\{x_1 \ldots x_{n1}\}$ and H represents all possible permutations of subset $A_2$'s inputs $\{x_{n1+1} \ldots x_n\}$, the two subsets, along with their permutations, may be represented as a pair of permutation groups (G, $A_1$) and (H, $A_2$).

The direct sum of (G, $A_1$) and (H, $A_2$), represented as $G \oplus H$, can then be derived by Equation (1):

$$G \oplus H = (G \times H, A_1 \cup A_2) \quad (1)$$

where × is the Cartesian coordinate vector operator and $\cup$ is the set-union operator.

An intrinsic characteristic of this usage of the direct-sum function is the fact that the above computation does not generate permutations of inputs comprised by two distinct subsets. That is, $G \oplus H$ identifies permutations of inputs contained in either $A_1$ or $A_2$, but does not identify permutations that swap an input comprised by a first subset $A_1$ with an input comprised by a second subset $A_2$. As a result, no permutation produced by direct sum $G \oplus H$ can shift an input from one subset to the other.

If, for example, G comprises permutations of a subset $A_1$ that consists of inputs $\{1, 2, 3\}$, and H comprises permutations of a subset $A_2$ that consists of inputs {4, 5, 6}, then G⊕H could produce permutations that comprise:

a permutation of inputs comprised by $A_1$, such as (1,2) (exchange inputs 1 and 2, but leave inputs 3, 4, 5, and 6 unchanged) or (2,3) (exchange inputs 2 and 3, but leave inputs 1, 4, 5, and 6 unchanged); or a permutation of inputs comprised by $A_2$, such as (4,5) (exchange inputs 4 and 5, but leave inputs 1, 2, 3, and 6 unchanged) or (5,6) (exchange inputs 5 and 6, but leave inputs 1, 2, 3, and 4 unchanged);

In no case, however, could G⊕H generate permutations that mix inputs of $A_1$ with inputs of $A_2$, such as (1,2,6) or (4,5,3).

This computation may be generalized to cases that comprise more than two subgroups or divisions of a q-module's n inputs. If, for example, a q-module's inputs are represented as an n-element vector $\underline{x}=(x_1 \ldots x_n)$, each group of permutations $G_i$ would operate on a mutually exclusive subset of $\underline{x}$, such that every input of $\underline{x}$ is contained in one and only one of the mutually exclusive subsets of $\underline{x}$.

For every set of inputs $\underline{x}=\{x_1, x_2, \ldots x_n\}$ and every method of division of those inputs into of k subsets $\{A_i\}$ there exists a function $f_k(\underline{x})$ such that $S(f_k)$ (the invariance group of $f_k(\ )$) is a direct sum of permutation groups that each act on one of the subsets $A_i$.

This function $f_k(\underline{x})$ may be represented by Equation (2), where $0^n$ represents a string of n inputs in a 0 state and $1^n$ represents a string of n inputs in a 1 state. Here $\underline{x}_1$ is a vector of length $(n_1+ \ldots +n_{k-1})$ and $\underline{x}_2$ is a vector of length $n_k$. As in previous examples, $|\underline{x}|=n=(n_1+n_2)=(n_1+ \ldots +n_k)$ $$f_k(\underline{x}) = \begin{cases} 0, & x = x_1 0^{n_k} \\ f_{k-1}(x), & x = x_1 1^{n_k} \\ 1, & x = 0^{n_1+n_2+\ldots+n_{k-1}} x_2, x_2 \neq 0^{n_k}, 1^{n_k} \\ 0, & x = 1^{n_1+n_2+\ldots+n_{k-1}} x_2, x_2 \neq 0^{n_k}, 1^{n_k} \\ 0, & \text{Otherwise} \end{cases} \quad (2)$$

Here, function $f_k(\underline{x})$ (the operation performed by a q-module on vector $\underline{x}$, where an input vector $\underline{x}$ has been divided into k subsets) returns a value of 0 or 1. This function is semi-recursive because in some cases, its output is determined by recursively calling the same function f( ) for any k−1 subsets of the k subsets).

In this example:

if input vector $\underline{x}$ comprises any $n_1$ input states followed by $n_k$ ZERO states, $f_k(\underline{x})=0$ if $\underline{x}$ comprises any $n_1$ input states followed by $n_k$ ONE states, then $f_k(\underline{x})=$a value derived by semi-recursively calling $f_{k-1}(\underline{x})$ if $\underline{x}$ comprises any $(n_1+n_2+ \ldots +n_{k-1})$ ZERO states, followed by any $n_2$ input states that are neither all ZERO states nor all ONE states, then $f_k(\underline{x})=1$ if $\underline{x}$ comprises any $(n_1+n_2+ \ldots + n_{k-1})$ ONE states, followed by any $n_2$ input states that are neither all ZERO states nor all ONE states, then $f_k(\underline{x})=0$ otherwise $f_k(\underline{x})=0$.

In a simple example, consider the case where k=2 (that is, where the input vector of the q-module was divided into two subvectors $\underline{x}_1$ and $\underline{x}_2$ in step 210), where $|\underline{x}_1|=n_1$, $|\underline{x}_2|=n_2$, and $|\underline{x}|=(n_1+n_2)=n$, the total number of inputs. In this example, we arbitrarily derive an output value of $f_{k-1}(\underline{x})$ to be equal to 1.

This yields:

$$f_1(x) = 1$$

$$f_2(x) = \begin{cases} 0, & x = x_1 0^{n_2} \\ f_1(x), & x = x_1 1^{n_2} \\ 1, & x = 0^{n_1} x_2, x_2 \neq 0^{n_2}, 1^{n_2} \\ 0, & x = 1^{n_1} x_2, x_2 \neq 0^{n_2}, 1^{n_2} \\ 0, & \text{Otherwise} \end{cases}$$

$$f_2(\underline{x}) = \begin{cases} 0, & \underline{x} = \underline{x}_1 0^{n_2} \\ 1, & \underline{x} = \underline{x}_1 1^{n_2} \\ 1, & \underline{x} = 0^{n_1} \underline{x}_2, \underline{x}_2 \neq 0^{n_2}, 1^{n_2} \\ 0, & \underline{x} = 1^{n_1} \underline{x}_2, \underline{x}_2 \neq 0^{n_2}, 1^{n_2} \\ 0, & \text{Otherwise} \end{cases}$$

In this simple two-state example:

if input vector $\underline{x}$ consists of any $n_1$ input states followed by $n_2$ ZERO states, $f_2(x)=0$ if $\underline{x}$ consists of any $n_1$ states followed by $n_2$ ONE states, then $f_2(x)=f_1(x)=1$, a value derived by semi-recursively calling $f_{k-1}(x)$ if $\underline{x}$ consists of any $n_1$ ZERO states, followed by any $n_2$ input states that are neither all ZERO states nor all ONE states, then $f_2(x)=1$ if $\underline{x}$ consists of any $n_1$ ONE states, followed by any $n_2$ input s that are neither all ZERO states nor all ONE states, then $f_2(x)=0$ otherwise $f_2(\underline{x})=0$.

In step 220, the system uses the functions and invariance group derived in step 215 as the direct sums of the subsets identified in step 215 to streamline the testing of the q-module. This invariance group specifies a set of invariant or symmetrical permutations that, when performed upon the q-module's inputs, do not cause the q-module's output to change.

Consider a simple example in which a q-module has four inputs {x1, x2, x3, x4}, that are divided in step 210 into two subsets (x1, x2) and (x3, x4). The direct sum of these two groups, as computed by Equation (1), yields an invariance group that comprises four permutations, including the trivial-case identity permutation (id), which specifies that no inputs are permuted:

{(id),(1,2),(3,4),(1,2)(3,4)}

This invariance group indicates that the output of the q-module does not change when:

input x1 is exchanged with input x2, input x3 is exchanged with input x4, or x1 is exchanged with x2 and x3 is exchanged with x4, Permutations comprised by the previously identified invariance group may be used to identify certain input vectors $\underline{x}$ of the q-module that do not need to be tested. Because permuting the q-module's input vectors by means of a permutation of the invariance group does not change the q-module's output, once one input vector has been tested, it is not necessary to test any other vectors that may be derived by performing invariant permutations upon the previously tested vector.

This increased test efficiency is illustrated in Table 1 below, which is based on the previous 4-input/2-state example, in which an invariance group consists of the set of permutations:

$S(f)=\{(id),(1,2),(3,4),(1,2)(3,4)\}$

Here, permutation (x1, x2) specifies that permuting states of the first two inputs of the q-module does not change the output state of the q-module. Therefore, there is no need to test any input vector $\underline{x}$ that differs from a previously verified input vector $\underline{x}$ only in the order of the states of the first two inputs. For example, if the q-module is known to produce correct output in response to input vector $\underline{x}=(1,0,1,1)$, it is not necessary to test the operation of the q-module when input $\underline{x}$ is permuted to $(0,1,1,1)$.

Table 1 illustrates an example of how a q-module test procedure may be optimized by considering the four-permutation invariance group enumerated above:

$$S(f)=\{(id),(1,2),(3,4),(1,2)(3,4)\}$$

Here, once input vector (0,1,1,0) has been verified, there is no need to test the following permutations:

(0,1,1,0) (the trivial (id) permutation)
(1,0,1,0) (permutation (1,2): swap 1 with 2)
(0,1,0,1) (permutation (3,4): swap 3 with 4); and
(1,0,0,1) (permutation (1,2) (3,4): swap 1 with 2 and swap 3 with 4)

Table 1 illustrates this example for all possible values of input vector x of the four-input, two-state q-module. The first four columns identify all possible input states identified by 4-tuple input vector $\underline{x}$, which represents inputs that may be received by the q-module. The fifth column identifies whether a test procedure is required to verify the output produced by function $f_2(\underline{x})$, which defines the expected operation of the q-module, for each possible value of input vector $\underline{x}$. Permutations of previously verified vectors $\underline{x}$ that do not need to be tested are identified by the term "NOTEST."

TABLE 1

| x1 | x2 | x3 | x4 | $f_2$(x1, x2, x3, x4) |
|----|----|----|----|------------------------|
| 0 | 0 | 0 | 0 | TEST |
| 0 | 0 | 0 | 1 | TEST |
| 0 | 0 | 1 | 0 | NOTEST |
| 0 | 0 | 1 | 1 | TEST |
| 0 | 1 | 0 | 0 | TEST |
| 0 | 1 | 0 | 1 | TEST |
| 0 | 1 | 1 | 0 | NOTEST |
| 0 | 1 | 1 | 1 | TEST |
| 1 | 0 | 0 | 0 | NOTEST |
| 1 | 0 | 0 | 1 | NOTEST |
| 1 | 0 | 1 | 0 | NOTEST |
| 1 | 0 | 1 | 1 | NOTEST |
| 1 | 1 | 0 | 0 | TEST |
| 1 | 1 | 0 | 1 | TEST |
| 1 | 1 | 1 | 0 | NOTEST |
| 1 | 1 | 1 | 1 | TEST |

In a similar manner, an invariance group may be used to reduce the total number of tests required to completely verify other q-modules. In the above 4-input, 2-output-state example, the total number of tests is reduced from 16 to 9, but when the number of inputs or the number of input or output states of a q-module increases, embodiments of the present invention may allow very large numbers of tests to be eliminated.

For example, if a q-module has 10 inputs {x1 ... x10} divided into k=2 subsets $A_1=\{x1, x2, \ldots, x5\}$ and $A_2=\{x6, x7, \ldots, x10\}$, a symmetry group can be derived as a direct sum of two groups. Instead of requiring $2^{10}=1024$ tests, embodiments of the present invention would allow the q-module to be fully verified with only 36 sets of input values.

Similarly, if a q-module has 100 inputs divided into k=2 subsets {x1, x2, ..., x50} and {x51, x52, ..., x100}, an invariance group could be generated as the group of all permutations of these two input subsets. Here, instead of requiring $2^{100}$ tests to completely verify the circuit, embodiments of the present invention would require only 2601 values.

These reductions in the number of required tests can be generalized. Methods of the present invention may, for example, use group theory to determine whether $f(\underline{x})$ is invariant under $S(\{1, 2, \ldots, n\}) \oplus S(\{n+1, n+2, \ldots, 2n\})$ where $S(\underline{x}_n)$ is a group of all permutations of an input subset $\underline{x}_n$. If S(f) creates a group $S(\{1, 2, \ldots, n\})$, the generators of that group are can be determined, through means known in the art, to be permutations (1, 2) and (1, 2, ..., n). Determining whether f( ) is invariant under $S(\{1, 2\})$ requires evaluation of two conditions, and determining whether f( ) is invariant under $S(\{1, 2, \ldots, n\}) \oplus S(\{n+1, n+2, \ldots, 2n\})$ requires evaluation of only four conditions, rather than (2n)! conditions.

This maybe expressed formally for any q-module and function f( ). If S(f) is direct sum of groups $\{(G_1, A_1), (G_2, A_2), \ldots, (G_k, A_k)\}$, then the q-module may be fully tested by testing only permutations $\{(1, 2), (1, 2, \ldots, n_1), (n_1+1, n_1+2), (n_1+1, n_1+2, \ldots, n_1+n_2), \ldots, (n_1+n_2+ \ldots +n_{k-1}+1, n_1+n_2+ \ldots +n_{k-1}+2), (n_1+n_2+ \ldots +n_{k-1}+1, n_1+n_2+ \ldots +n_{k-1}+2, \ldots, n)\}$.

What is claimed is:

1. A quantum-logic test-development system comprising a processor, a memory coupled to the processor, and a computer-readable hardware storage device coupled to the processor, the storage device containing program code configured to be run by the processor via the memory to implement a method for using direct sums and invariance groups to test partially symmetric quantum-logic circuits, the method comprising: the system receiving architectural information about a quantum-logic circuit that has at least four inputs and at least one output; the system, as a function of the architectural information, dividing the at least four inputs into two or more non-intersecting subsets; the system creating a set of groups that each comprise a subset, selected from the set of two or more non-intersecting subsets, and one or more permutation operations, where no individual operation of the one or more permutation operations comprises any characteristic capable of precluding the individual operation from-being performed upon inputs comprised by the selected subset; the system generating a direct sum of the set of groups, where the direct sum identifies an invariance group of a function that represents functionality of the quantum-logic circuit, where the invariance group comprises a set of invariant permutations, where each permutation of the set of invariant permutations identifies a permutation of two or more inputs comprised by one and only one subset of the two or more non-intersecting subsets, and where no output of the quantum-logic circuit changes state when any permutation of the set of invariant permutations is performed upon the at least four inputs of the quantum-logic circuit; the system optimizing a procedure for testing the quantum-logic circuit, where the procedure comprises a series of tests that each verify correct operation of the quantum-logic circuit in response to receiving a distinct input vector of a set of input vectors, and where the optimizing comprises deleting from the series of tests any test associated with an input vector, where the input vector comprises no characteristic capable of precluding the input vector from being generated by performing a permutation of the set of invariant permutations upon a distinct input vector associated with a previous test of the series of tests.

2. The system of claim 1, where the received architectural information identifies a number of inputs of the circuit, a number of outputs of the circuit, a maximum number of concurrent states associated with each input of the circuit, and a maximum number of concurrent states associated with each output of the circuit.

3. The system of claim 2, where a first group of the set of groups comprises a first subset of the non-intersecting subsets and a first set of all permutations capable of being performed upon inputs that consist solely of inputs comprised by the first subset.

4. The system of claim 2, where a direct sum of a first group of the set of groups, consisting of a first subset of the non-intersecting subsets and a first set of all permutations capable of being performed upon the first subset, and a second group of the set of groups, consisting of a second subset of the non-intersecting subsets and a second set of all permutations capable of being performed upon the second subset, generates an invariance group that comprises: i) a Cartesian product of the first set of permutations and the second set of permutations, and ii) a set formed by a union of the first subset and the second subset.

5. The system of claim 2, where $f_k(\underline{x})$ is a semi-recursive function that returns an output state produced by the quantum-logic module in response to receiving an input vector $\underline{x}$.

6. The system of claim 5, where $f_k(\underline{x})$ represented by the equation:

$$f_k(\underline{x}) = \begin{cases} 0, & \underline{x} = \underline{x}_1 0^{n_k} \\ f_{k-1}(\underline{x}), & \underline{x} = \underline{x}_1 1^{n_k} \\ 1, & \underline{x} = 0^{n_1+n_2+\cdots+n_{k-1}} \underline{x}_2, \quad \underline{x}_2 \neq 0^{n_k}, 1^{n_k} \\ 0, & \underline{x} = 1^{n_1+n_2+\cdots+n_{k-1}} \underline{x}_2, \quad \underline{x}_2 \neq 0^{n_k}, 1^{n_k} \\ 0, & \text{otherwise} \end{cases}$$

where the quantum-logic circuit has n inputs that can each assume any of two or more states,
where the quantum-logic circuit has one output that can assume any of at least two states,
where k is a total number of the two or more non-intersecting subsets,
where $n_i$ is a number of inputs in an $i^{th}$ subset of the two or more non-intersecting subsets, such that $(n_1 + \ldots + n_k) = n$,
where $\underline{x}$ is an input vector that represents an ordered list of a set of states of the n inputs,
where $\underline{x}1$ and $\underline{x}_2$ are vectors that each represent an ordered list of a subset of the set of states of the n inputs,
where a length of $\underline{x}=n$, a length of $\underline{x}_1=(n_1+\ldots+n_{k-1})$, and a length of $\underline{x}_2=n_k$,
where $0^i$ represents a string of i zero values,
where $1^i$ represents a string of i one value, and
where $f_{k-1}(\underline{x})$ is a recursive function call to $f(\underline{x})$ where inputs of the quantum-logic circuit are divided into k−1 nonintersecting subsets.

7. The system of claim 2, where the quantum-logic circuit has one output.

8. A method for using direct sums and invariance groups to test partially symmetric quantum-logic circuits, the method comprising: receiving architectural information about a quantum-logic circuit that has at least four inputs and at least one output; dividing the at least four inputs, as a function of the architectural information, into two or more non-intersecting subsets; creating a set of groups that each comprise a subset, selected from the set of two or more non-intersecting subsets, and one or more permutation operations, where no individual operation of the one or more permutation operations comprises any characteristic capable of precluding the individual operation from being performed upon inputs comprised by the selected subset; generating a direct sum of the set of groups, where the direct sum identifies an invariance group of a function that represents functionality of the quantum-logic circuit, where the invariance group comprises a set of invariant permutations, where each permutation of the set of invariant permutations identifies a permutation of two or more inputs comprised by one and only one subset of the two or more non-intersecting subsets, and where no output of the quantum-logic circuit changes state when any permutation of the set of invariant permutations is performed upon the at least four inputs of the quantum-logic circuit; the system optimizing a procedure for testing the quantum-logic circuit, where the procedure comprises a series of tests that each verify correct operation of the quantum-logic circuit in response to receiving a distinct input vector of a set of input vectors, and where the optimizing comprises deleting from the series of tests any test associated with an input vector, where the input vector comprises no characteristic capable of precluding the input vector from being generated by performing a permutation of the set of invariant permutations upon a distinct input vector associated with a previous test of the series of tests.

9. The method of claim 8, where the received architectural information identifies a number of inputs of the circuit, a number of outputs of the circuit, a maximum number of concurrent states associated with each input of the circuit, and a maximum number of concurrent states associated with each output of the circuit.

10. The method of claim 8, where a first group of the set of groups comprises a first subset of the non-intersecting subsets and a first set of all permutations capable of being performed upon inputs that consist solely of inputs comprised by the first subset.

11. The method of claim 8, where a direct sum of a first group of the set of groups, consisting of a first subset of the non-intersecting subsets and a first set of all permutations capable of being performed upon the first subset, and a second group of the set of groups, consisting of a second subset of the non-intersecting subsets and a second set of all permutations capable of being performed upon the second subset, generates an invariance group that comprises: i) a Cartesian product of the first set of permutations and the second set of permutations, and ii) a set formed by a union of the first subset and the second subset.

12. The method of claim 8, where $f_k(\underline{x})$ is a semi-recursive function that returns an output state produced by the quantum-logic module in response to receiving an input vector $\underline{x}$, and where $f_k(\underline{x})$ is represented by the equation:

$$f_k(\underline{x}) = \begin{cases} 0, & \underline{x} = \underline{x}_1 0^{n_k} \\ f_{k-1}(\underline{x}), & \underline{x} = \underline{x}_1 1^{n_k} \\ 1, & \underline{x} = 0^{n_1+n_2+\cdots+n_{k-1}} \underline{x}_2, \quad \underline{x}_2 \neq 0^{n_k}, 1^{n_k} \\ 0, & \underline{x} = 1^{n_1+n_2+\cdots+n_{k-1}} \underline{x}_2, \quad \underline{x}_2 \neq 0^{n_k}, 1^{n_k} \\ 0, & \text{otherwise} \end{cases}$$

where the quantum-logic circuit has n inputs that can each assume any of two or more states, where the quantum-logic circuit has one output that can assume any of at least two states, where k is a total number of the two or more non-intersecting subsets, where $n_i$ is a number of inputs in an $i^{th}$ subset of the two or more non-intersecting subsets, such that $(n_1 + \ldots + n_k) = n$, where $\underline{x}$ is an input vector that represents an ordered list of a set of states of the n inputs, where $\underline{x_1}$ and $\underline{x_2}$ are vectors that each represent an ordered list of a subset of the set of states of the n inputs, where a length of $\underline{x} = n$, a length of $\underline{x_1} = (n_1 + \ldots + n_{k-1})$, and a length of $\underline{x_2} = n_k$, where $0^i$ represents a string of i zero values, where $1^i$ represents a string of i one value, and where $f_{k-1}(\underline{x})$ is a recursive function call to $f(\underline{x})$ where inputs of the quantum-logic circuit are divided into k−1 nonintersecting subsets.

13. The method of claim 8, further comprising providing at least one support service for at least one of creating, integrating, hosting, maintaining, and deploying computer-readable program code in the computer system, wherein the computer-readable program code in combination with the computer system is configured to implement the receiving, the dividing, the creating, and the generating.

14. A computer program product, comprising a computer-readable hardware storage device having a computer-readable program code stored therein, the program code configured to be executed by a quantum-logic test-development system comprising a processor, a memory coupled to the processor, and a computer-readable hardware storage device coupled to the processor, the storage device containing program code configured to be run by the processor via the memory to implement a method for using direct sums and invariance groups to test partially symmetric quantum-logic circuits, the method comprising: receiving architectural information about a quantum-logic circuit that has at least four inputs and at least one output; dividing the at least four inputs, as a function of the architectural information, into two or more non-intersecting subsets; creating a set of groups that each comprise a subset, selected from the set of two or more non-intersecting subsets, and one or more permutation operations, where no individual operation of the one or more permutation operations comprises any characteristic capable of precluding the individual operation from being performed upon inputs comprised by the selected subset; generating a direct sum of the set of groups, where the direct sum identifies an invariance group of a function that represents functionality of the quantum-logic circuit, where the invariance group comprises a set of invariant permutations, where each permutation of the set of invariant permutations identifies a permutation of two or more inputs comprised by one and only one subset of the two or more non-intersecting subsets, and where no output of the quantum-logic circuit changes state when any permutation of the set of invariant permutations is performed upon the at least four inputs of the quantum-logic circuit; the system optimizing a procedure for testing the quantum-logic circuit, where the procedure comprises a series of tests that each verify correct operation of the quantum-logic circuit in response to receiving a distinct input vector of a set of input vectors, and where the optimizing comprises deleting from the series of tests any test associated with an input vector, where the input vector comprises no characteristic capable of precluding the input vector from being generated by performing a permutation of the set of invariant permutations upon a distinct input vector associated with a previous test of the series of tests.

15. The computer program product of claim 14, where the received architectural information identifies a number of inputs of the circuit, a number of outputs of the circuit, a maximum number of concurrent states associated with each input of the circuit, and a maximum number of concurrent states associated with each output of the circuit.

16. The computer program product of claim 14, where a first group of the set of groups comprises a first subset of the non-intersecting subsets and a first set of all permutations capable of being performed upon inputs that consist solely of inputs comprised by the first subset.

17. The computer program product of claim 14, where $f_k(\underline{x})$ is a semi-recursive function that returns an output state produced by the quantum-logic module in response to receiving an input vector $\underline{x}$, and where $f_k(\underline{x})$ is represented by the equation:

$$f_k(\underline{x}) = \begin{cases} 0, & \underline{x} = \underline{x_1} 0^{n_k} \\ f_{k-1}(\underline{x}), & \underline{x} = \underline{x_1} 1^{n_k} \\ 1, & \underline{x} = 0^{n_1 + n_2 + \cdots + n_{k-1}} \underline{x_2}, \quad \underline{x_2} \neq 0^{n_k}, 1^{n_k} \\ 0, & \underline{x} = 1^{n_1 + n_2 + \cdots + n_{k-1}} \underline{x_2}, \quad \underline{x_2} \neq 0^{n_k}, 1^{n_k} \\ 0, & \text{otherwise} \end{cases}$$

where the quantum-logic circuit has n inputs that can each assume any of two or more states, where the quantum-logic circuit has one output that can assume any of at least two states, where k is a total number of the two or more non-intersecting subsets, where $n_i$ is a number of inputs in an $i^{th}$ subset of the two or more non-intersecting subsets, such that $(n_1 + \ldots + n_k) = n$, where $\underline{x}$ is an input vector that represents an ordered list of a set of states of the n inputs, where $\underline{x_1}$ and $\underline{x_2}$ are vectors that each represent an ordered list of a subset of the set of states of the n inputs, where a length of $\underline{x} = n$, a length of $\underline{x_1} = (n_1 + \ldots + n_{k-1})$, and a length of $\underline{x_2} = n_k$, where $0^i$ represents a string of i zero values, where $1^i$ represents a string of i one value, and where $f_{k-1}(\underline{x})$ is a recursive function call to $f(\underline{x})$ where inputs of the quantum-logic circuit are divided into k−1 nonintersecting subsets.

* * * * *